DIFFERENTIAL POWER AMPLIFIER
Filed Sept. 26, 1963
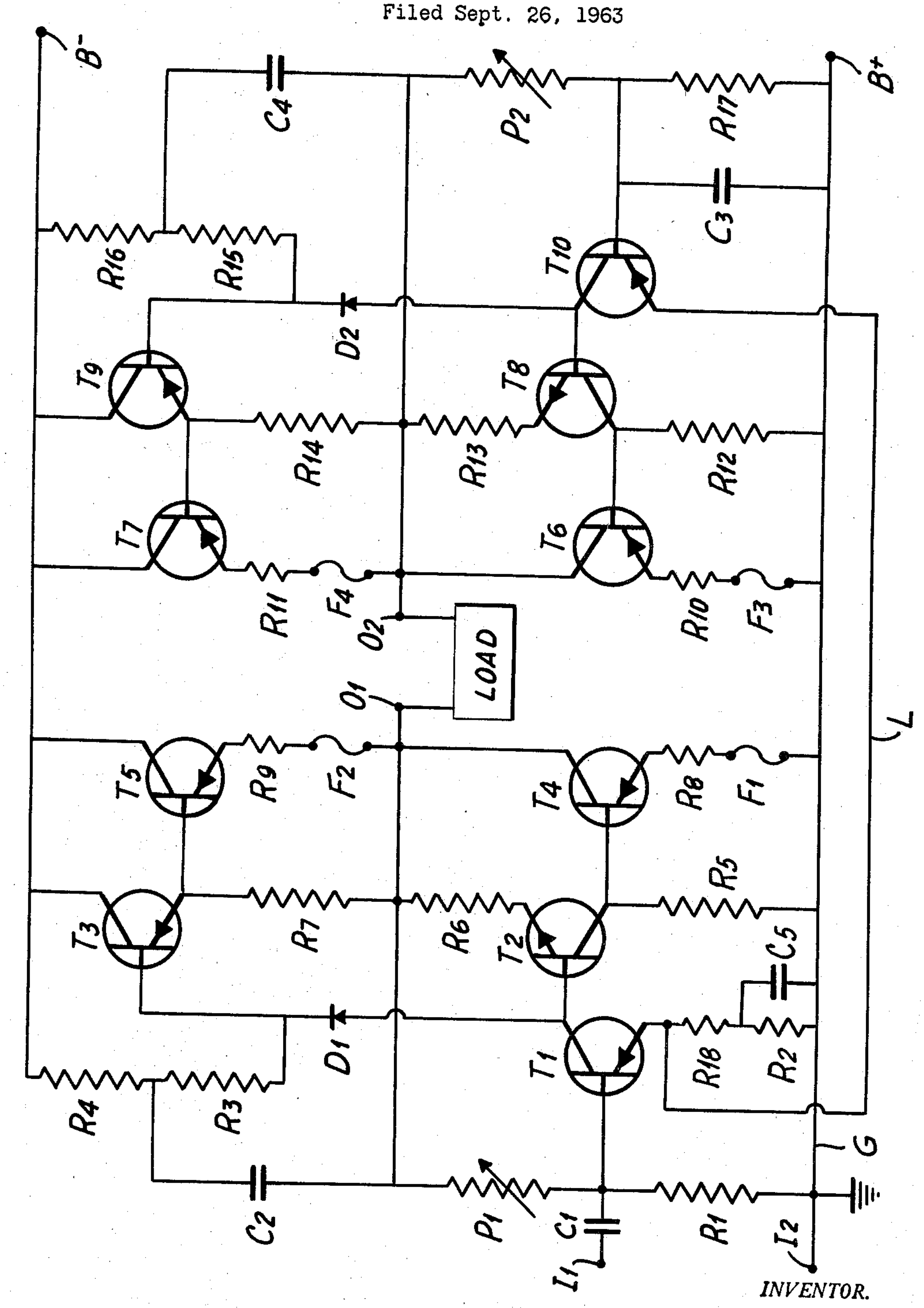
INVENTOR.
Martin G. Reiffin 3,372,342
Patented Mar. 5, 1968

3,372,342

DIFFERENTIAL POWER AMPLIFIER

Martin G. Reiffin, 515 Cathedral Parkway, New York, N.Y. 10025

Filed Sept. 26, 1963, Ser. No. 311,732
20 Claims. (Cl. 330—15)

This invention relates generally to transistor power amplifiers and more particularly to such amplifiers of the transformerless type having high power output and low distortion so as to be suitable for high fidelity music reproduction.

In the prior art the most widely known transistor power amplifier circuit is a modification of that disclosed by H. C. Lin in United States Patent No. 2,896,029 issued July 21, 1959. This patented circuit comprises a first stage of voltage amplification in the form of a common-emitter transistor having its collector output capacitor-coupled to the respective bases of a push-pull pair of complementary transistors constituting the second or drive stage. The latter is in turn direct-coupled to a third or output stage comprising a pair of power transistors in a push-pull single-ended half-bridge transformerless connection. The loudspeaker or other load is direct-coupled between the midpoint of the output stage and the midpoint of the power supply.

The Lin circuit inherently involves several limitations. First, the maximum power output is limited to about ten watts when utilizing currently available germanium transistors or moderately expensive silicon transistors. Second, the bias of the output stage is unstable so that variations in temperatures or component parameters produce bia deviations from the optimum condition required for maximum power and minimum distortion. Third, the circuit cannot maintain the output terminal of the power stage at the same D.C. potential as the midpoint of the power supply, with the result that a spurious direct current independent of the signal may flow through the speaker voice coil so as to increase the distortion generated by the speaker. Fourth, the circuit is not dynamically balanced for both halves of the signal swing, during one half of the swing one output transistor operating in a common-collector connection and during the other half of the swing the other output transistor operating in a common-emitter connection.

In order to eliminate substantial deviations from optimum output stage bias this patented circuit is generally modified by direct-coupling the collector output of the common-emitter transistor to the drive stage and providing a D.C. negative feedback connection from the output of the power stage to the base of the common-emitter transistor to maintain the D.C. potential of the output at a substantially constant optimum value midway between the two extreme potentials of the power supply terminals. In order to obviate direct current flow through the speaker, the Lin circuit is generally further modified to include a coupling capacitor between the power stage output and one speaker terminal, the other speaker terminal being connected to ground rather than to the midpoint of a split power supply.

Specific embodiments of the circuit as so modified were widely popularized by publication in the various editions of the General Electric Company's "Transistor Manual." However this modified circuit does not obviate the limitatitons of inadequate power output and unbalanced push-pull operation, and presents another major disadvantage in that the output coupling capacitor provides at low frequencies a rolloff and a phase shift, and at high frequencies a substantial stray capacitance to ground. Elimination of the coupling capacitor and reversion to direct coupling of the load as in the original Lin circuit is not entirely satisfactory in conjunction with the D.C. negative feedback loop because the latter maintains the potential of the power stage output terminal relatively constant whereas under heavy load the power supply regulation causes the potential of the midpoint terminal of the power supply to drop, thereby producing a difference in D.C. potential across the speaker terminals and causing a spurious signal-independent D.C. current component to flow through the speaker.

It is therefore a primary object of the present invention to provide a novel transistor power amplifier circuit having all of the advantages of the above-noted prior circuits but capable of about four times the maximum power output of the latter, and also having a stable output stage bias, perfect dynamic balance for both halves of the signal swing, and direct-coupling to the speaker without any substantial spurious direct current through the latter.

This is achieved in the preferred embodiments of the present invention by providing the usual complementary-symmetry push-pull drive stage direct-coupled to the usual single-ended push-pull power stage in combination with a second complementary-symmetry drive stage direct-coupled to a second single-ended push-pull power stage, with the speaker or load direct-coupled to the outputs of the two power stages. A suitable phase inversion arrangement provides oppositely-phased replicas of the input signal to the drive stages so that each power stage, in addition to having two transistors which operate in push-pull relation to each other, also operates in push-pull relation to the other power stage. Symmetry and balance are thus achieved for both halves of the signal swing.

Since the maximum voltage across the load for given transistor breakdown voltage ratings is thus double that which is obtained in the half-bridge circuits of the prior art, the maximum power output is thereby four times that of the prior circuits.

Furthermore, in addition to the usual common-emitter stage direct-coupled to the usual drive stage and fed back with a direct-current negative feedback loop from the output of the usual single-ended power stage to maintain the bias of the latter substantially constant at its optimum value midway between the potentials of the power supply terminals, the disclosed embodiment of the present invention also comprises a second common-emitter stage direct-coupled to the second drive stage and fed back with a second direct-current negative feedback loop from the output of the second power stage. Thus both output terminals of the amplifier are maintained at substantially constant and equal D.C. potentials to provide optimum bias and to permit the speaker to be direct-coupled to the output terminals without causing a substantial amount of direct current to flow through the speaker, thereby eliminating the frequency response rolloff and phase shift inherent in the use of an output coupling capacitor.

In the disclosed embodiment there is provided a novel arrangement for further reducing any tendency of the output terminals to differ in D.C. potential. That is, any variation in the potential of the output terminal of one power stage causes a change in bias of the common-emitter stage associated with the other power stage so as to cause the potential of the other output terminal to vary in the same direction and to approximately the same extent as the potential of the originally-varied output terminal. In the disclosed embodiment this highly-advantageous result is achieved by merely connecting the emitters of the two common-emitter stages to ground through a common resistor.

Furthermore, by applying the signal to the base of one common-emitter stage and A.C. coupling the base of the other common-emitter stage to ground, this arrangement also provides the required phase inversion for driving the two power stages in mutual push-pull relation, and thus serves to provide both of the novel functions, as well as the conventional function of voltage amplification.

Other objects and advantages of the present invention are either inherent in the structure disclosed or will become apparent to those skilled in the art as the detailed description proceeds in connection with the accompanying drawing showing wherein FIG. 1 is a circuit diagram of a transistor power amplifier in accordance with the present invention.

Referring now to the drawing in more detail, transistor T1 constitutes the first common-emitter voltage-amplification stage, transistors T2, T3 constitute the first complementary-symmetry push-pull drive stage, and transistors T4, T5 constitute the first single-ended push-pull power output stage. Transistor T10 constitutes the second common-emitter voltage-amplification stage, transistors T8, T9 constitute the second complementary-symmetry push-pull drive stage, and transistors T6, T7 constitute the second single-ended push-pull power output stage.

One input terminal I1 is coupled by capacitor C1 to the base of transistor T1 and the other input terminal I2 is connected to the ground lead G. Bias for the base of transistor T1 is provided by resistor R1 connected between the base and ground and by a variable resistor in the form of potentiometer P1 connected between the base and the output terminal O1 of the first power stage T4, T5. The collector of transistor T1 is connected to a resistive bias element in the form of a diode D1 which is in turn connected to resistor R3 in series with another resistor R4 which is in turn connected to the negative terminal $B^-$ of a conventional power supply (not shown). The positive terminal $B^+$ of the power supply is grounded.

Resistors R3 and R4 constitute the collector load for transistor T1. Diode D1 provides temperature compensation for the bias of the drive stage T2, T3 in the manner well-known in the art. A capacitor C2 connected between output O1 and the junction of resistors R3, R4 provides bootstrapping to partially reduce the inequality of the swing of the two halves of the signal of the inherently unbalanced first drive stage T2, T3 and first power stage T4, T5, as is also well-known.

The emitter of transistor T1 is connected to ground through an unbypassed resistor R18 in series with another resistor R2 which is bypassed by a capacitor C5. Resistor R2 provides most of the potential drop required for proper bias whereas resistor R18 provides the function of phase inversion. Both of these resistors provide the function of potential equalization of output terminals O1, O2 as will be explained below.

The emitter of the second common-emitter transistor T10 is connected by a lead L to the upper end of resistor R18. The base of transistor T10 is A.C. coupled to ground by capacitor C3. Bias for the base of transistor T10 is provided by resistor R17 connected between the base and ground in conjunction with potentiometer P2 connected between the base and output terminal O2. The collector of transistor T10 is connected to a temperature-compensating resistive bias element in the form of diode D2 which is in turn connected to the series load resistors R15, R16 connected to the negative supply terminal $B^-$ and having their junction connected to a bootstrapping capacitor C4 extending from output terminal O2.

The lower transistors T2 and T8 of the two drive stages are of NPN type whereas the upper transistors T3 and T9 are of PNP type so that each drive stage comprises a complementary pair of transistors. The base of the lower transistor T2 of the first drive stage is direct-coupled to the collector of transistor T1 at the lower end of diode D1, and the base of the upper transistor T3 is similarly direct-coupled at the upper end of diode D1. In the same manner the respective bases of transistors T8, T9 of the second drive stage are direct-coupled to the collector of transistor T10 at the opposite ends of diode D2. The collectors of upper transistors T3 and T9 of both drive stages are connected to the negative supply terminal $B^-$ and the collectors of lower transistors T2 and T8 are connected to the positive supply terminal $B^+$ through the respective bias resistors R5 and R12 which set the bias conditions for the succeeding respective power stages. Bias resistors R7 and R14 extend respectively from the emitters of upper drive transistors T3 and T9 to the respective output terminals O1 and O2. The latter are also connected to the respective emitters of lower drive transistors T2 and T8 by resistors R6 and R13.

The bases of the lower transistors T4 and T6 of each power stage are direct-coupled to the respective collectors of lower drive transistors T2 and T8. The bases of upper transistors T5 and T7 of each power stage are direct-coupled to the respective emitters of upper drive transistors T3 and T9. The collectors of upper power transistors T5 and T7 are connected to negative supply terminal $B^-$ and the collectors of lower power transistors T4 and T6 are connected to the respective output terminals O1 and O2. The emitters of upper power transistors T5 and T7 are also connected to output terminals O1 and O2 respectively through resistor R9 in series with fuse F2 and resistor R11 in series with fuse F4. The emitters of lower power transistors T4 and T6 are connected to positive supply terminal $B^+$ through resistor R8 in series with fuse F1 and resistor R10 in series with fuse F3, respectively.

The operation of the circuit of FIG. 1 is as follows: Transistors T1 and T10 are biased in Class A and provide voltage amplification, phase inversion, and D.C. balancing of output terminals O1, O2. These are the only stages of FIG. 1 which provide voltage amplification which is achieved by virtue of the common-emitter connection of T1 and the coupling of T1 to T10. An input signal fed into input terminal I1 is transmitted through coupling capacitor C1 to the base of T1 causing an amplified output signal at the collector of T1 which is transmitted to the drive stage T2, T3. Due to the unbypassed emitter resistor R18, the emitter of T1, and hence also the emitter of T10 coupled directly therto by lead L, undergo voltage excursions in phase with the signal at the base of T1. Since the base of T10 is grounded with respect to A.C. by capacitor C3, the resulting signal to the base-emitter circuit of T10 is reversed in phase with respect to that of T1. T1 and T10 thus constitute the transistor equivalent of the well-known cathode-coupled tube phase inversion circuit sometimes referred to as the "long-tailed pair."

To provide phase inversion in this manner is also known in the transistor art. However, transistors T1, T10 coact with the succeeding stages in what is believed to be a novel combination so as to provide a new function, namely, the automatic D.C. balancing of output terminals O1, O2 in the following manner:

The bias for the base of T1 is provided by the voltage divider fed by output O1 and comprising potentiometer P1 and resistor R1. Base bias is similarly provided to the base of T10 by potentiometer P2 and resistor R17 constituting a voltage divider fed by output O2. Assume, for example, that the D.C. voltage of output O1 becomes more negative due to a change in component parameters with temperature, age, or other cause. The voltage at the base of T1 will become more negative accordingly and the current will increase through the collector-emitter circuit of T1 thereby increasing the drop across emitter resistors R2, R18 so that the emitter of transistor T10 also becomes more negative. This causes a reduction in the current through the collector-emitter circuit of T10 and hence reduces the drop across collector load resistors R15, R16 so that the collector voltage of T10 becomes more negative. Due to the direct coupling between T10 and the succeeding emitter-follower drive stage T8, T9, and also between the latter and the succeeding power stage T6, T7, the voltage of output terminal O2 closely "follows" that of the collector of T10, as will be explained in more detail below. Therefore the increased negative D.C. voltage of one output terminal O1 produces a correspondingly increased negative D.C. voltage of the other output terminal O2. In a similar manner it will be seen that a variation in D.C. potential, in either direction, of either output terminal, produces a corresponding variation in the other terminal. By properly selecting the values of resistors R2, R18 in relation to the other circuit parameters, the terminals O1, O2 can be maintained substantially D.C. balanced over long periods of time and under varying ambient and operating conditions, so as to eliminate any significant D.C. current through the speaker voice coil or other load direct-coupled to said terminals.

The signal is transmitted from the collector of T1 to the drive stage T2, T3 by direct coupling to the respective bases of the latter at opposite ends of diode D1 which provides temperature-compensated bias voltages for said bases in the conventional manner. Since T2 and T3 operate as emitter-followers it will be seen that the potential of the junction of emitter resistors R6, R7 is maintained between the potentials at opposite ends of diode D1. Furthermore, since output terminal O1 is at the same potential as said junction, terminal O1 is effectively "locked" between the opposite end potentials of D1 as the collector of T1 swings up and down in response to a signal input. The potential drop across D1 is relatively small, and hence the potential swing of output terminal O1 follows closely the swing of the collector of T1, thereby achieving emitter-follower operation and low distortion in the drive and power stages.

The same mode of operation and advantages are achieved in the other half of the circuit comprising the other drive stage T8, T9 direct-coupled between the other voltage-amplification stage T10 and the other power stage T6, T7 constituting the other half of the full-bridge output arrangement.

Superficially it might appear that by duplicating the power stage to form a full bridge the maximum power capability of the subject amplifier is twice that of the prior art single-ended half-bridge circuits discussed above. Even if this were so it would constitute a substantial improvement in circuitry since placing duplicate power transistors in parallel in the prior art circuits merely increases the maximum power from about ten watts to about 12 watts due to a reduction in saturation resistance (General Electric Company "Transistor Manual," sixth edition, p. 137). However the present invention provides by this power stage duplication, not twice the power of a single-ended half-bridge stage, but about four times the power thereof.

This is because the two halves of the bridge are in series with respect to the load which thereby has applied to its terminals twice the voltage of an equivalent single-ended half-bridge circuit. Since the power is proportional to the square of the voltage, the maximum power output of the present invention is about four times that which can be achieved by said prior art single-ended circuits utilizing the same transistor types and power supply voltage.

The D.C. negative feedback loops including potentiometers P1, P2 extending from output terminals O1, O2 to the respective bases of transistors T1 and T10, in addition to their well-known functions of adjusting the quiescent D.C. potentials of terminals O1, O2 to their optimum value (midway between the potentials of the power supply terminals B+, B−) for maximum power and minimum distortion and then stabilizing the potentials at this optimum value, also provide a new function in the present circuit in that these feedback loops serve to minimize variations in the D.C. potentials of output terminals O1, O2 and thus cooperate with the above-discussed circuit features to further assure maintenance of equalized D.C. potentials on output terminals O1, O2 so as to permit direct-coupling of the load thereto without substantial direct current through the load.

By thus connecting the load directly to outputs O1, O2 at the collectors of the respective lower power transistors T5 and T7 the usual coupling capacitor is eliminated. Since this capacitor, even if of the order of several thousand microfarads, produces rolloff and phase shift at low frequencies, as well as stray capacitance at high frequencies, the direct-coupling to load arrangement of the present invention provides a substantial improvement in frequency response, maximum power capability at low and high frequencies, and feedback stability.

The latter characteristic is particularly important in that it enables the amplifier of the present invention to be utilized in a novel combination with a speaker having a motional feedback coil which may inject a large amount of negative feedback into an early stage of the amplifier without oscillation or other instability that would result with prior amplifiers having a load coupling capacitor with its inevitable large phase shift.

Furthermore, if only conventional negative feedback from the amplifier output terminal is to be employed, the increased stability resulting from the elimination of the phase shift inherent in the coupling capacitor enables the utilization of greater amounts of feedback than heretofore feasible, with the consequent advantages of reduced distortion, improved frequency response, and lower noise. Conventional feedback may be applied from output O1 to the base of T1 and from output O2 to the base of T10. However the amount of feedback which may be applied in this manner is limited by the moderate gain in T1 and T10. If greater amounts of feedback are desired, T1 may be preceded by another voltage-amplification common-emitter transistor stage with an unbypassed emitter resistor. The feedback network from O1 may then be fed to the emitter and the feedback network from O2 may be fed to the base of this transistor, thereby permitting the use of a greater amount of overall feedback than has heretofore been possible in prior amplifier circuits wherein the amount of feedback is limited by instability arising from phase shifting components which have been eliminated by the present invention.

It will be seen that the transistors of each power stage operate in push-pull relation to each other and that each stage also operates in push-pull relation to the other stage. Notwithstanding this double push-pull arrangement, unlike prior push-pull circuits the present invention makes it entirely unnecessary to match either the power transistors or the driver transistors. Assuming a proper value for resistor R18, the emitter-follower operation of the drive and power stages automatically provides proper dynamic balance for both halves of the signal swing even if the characteristics of the several driver and power transistors differ widely.

In order to minimize crossover distortion each power stage is biased in Class AB with a sufficient quiescent current for this purpose. The bias point is preferably close to the Class B point. Of course Class A operation may be employed if an adequate heat sink is provided to prevent thermal runaway.

It is to be understood that the specific embodiment disclosed herein is merely illustrative of one form which the invention may take in practice and that numerous modifications thereof will readily be made by those skilled in the art without departing from the scope of the invention as delineated in the appended claims, and that the claims are to be construed as broadly as permitted by the prior art. Several terms and phrases which appear in the specification or claims are hereby defined as follows. The terms "network" and "network means" and similar expressions are generic to both active networks including transistors and passive networks consisting solely of passive components such as conductors, resistors, capacitors, inductors. The expressions "direct-coupled" and "direct-current-coupled" are generic to include not merely a direct coupling but any coupling which has a conductor or direct-current transmission path, and the coupling may be either by way of a passive network or an active network. The term "transistor" includes any semiconductor device capable of voltage and/or current amplification. The expression "single-ended push-pull stage" refers to either a complementary symmetry stage or a stage where both transistors are of the same polarity type.

I claim:

1. A transistor amplifier comprising a power supply having a pair of supply terminals, a ground, one of said supply terminals being grounded and the other supply terminal being ungrounded, a pair of input terminals, one of said input terminals being grounded and the other input terminal being ungrounded, a pair of amplification stages each comprising a transistor having an emitter, a base and a collector, said emitters being connected to A.C. ground through a common impedance, means connecting the base of one of said transistors to the ungrounded input terminal, means connected between the base of the other transistor and said ground, a pair of resistive bias elements each having one end connected to the collector of a respective one of said transistors, a pair of load resistors each having one end connected to the other end of a respective one of said resistance bias elements, the opposite ends of said load resistors being connected to the ungrounded power supply terminal, a pair of push-pull stages each comprising a complementary pair of transistors each having an emitter, a base and a collector, means connecting the bases of said one push-pull stage to the respective opposite ends of one of said resistive bias elements, means connecting the bases of the other push-pull stage to the respective opposite ends of the other resistive bias element, means connecting one collector of each push-pull stage to one of said power supply terminals, and means connecting the other collector of each push-pull stage to the other power supply terminal.

2. A transistor amplifier as recited in claim 1 in combination with a pair of push-pull power stages each comprising a pair of transistors each having an emitter, a base and a collector, one transistor of each power stage having its emitter connected to ground and its collector connected to the emitter of the other transistor of the same stage, the collector of the other transistor of each power stage being connected to the ungrounded power supply terminal, the base of said one transistor of each power stage being connected to the collector of one transistor of a respective one of said push-pull complementary stages, the base of the other transistor of each power stage being connected to the emitter of the other transistor of each respective complementary push-pull stage, and a pair of output terminals each connected respectively to the collector of said one transistor of each power stage.

3. A transistor amplifier as recited in claim 2 and comprising a first direct-current feedback means connected between one of said output terminals and the base of one of said common-emitter stages, and a second direct-current feedback means connected between the other output terminal and the base of the other common-emitter stage.

4. A transistor power amplifier comprising a pair of push-pull power stages each including at least two transistors each having an emitter, a base and a collector, each stage having the collector of one transistor connected to the emitter of the other transistor, a pair of output terminals, one of said output terminals being connected to the collector of said one transistor of one power stage and the other output terminal being connected to the collector of said one transistor of the other power stage, power supply means connected to the emitter of said one transistor and the collector of the other transistor of each stage, means for feeding a push-pull signal to the bases of one power stage, means for feeding an oppositely phased replica of said signal to the bases of the other power stage, and bias means for said one power stage responsive to the D.C. potential of said other output terminal connected to the other power stage for varying the D.C. potential of said one output terminal in accordance with variations in D.C. potential of said other output terminal.

5. A transistor power amplifier as recited in claim 4 and comprising bias means for said other output stage responsive to the D.C. potential of said one output terminal for varying the D.C. potential of said other output terminal in accordance with variations in the D.C. potential of said one output terminal.

6. A transistor amplifier comprising a pair of amplification stages each comprising a transistor having an emitter, a base and a collector, a ground, said emitters being connected to A.C. ground through a common impedance, an input terminal for connection to a signal source, means connecting the base of one of said transistors to said input terminal, means coupling the base of the other transistor to said ground, a pair of resistive bias elements each having one end connected to a respective one of said collectors, a pair of load resistors each having one end connected to the opposite end of a respective one of said resistive bias elements, a power supply, the opposite ends of said load resistors being connected to said power supply, a pair of push-pull stages each comprising a complementary pair of transistors each having an emitter, a base and a collector, means direct coupling the bases of one push-pull stage to the respective opposite ends of one of said resistive bias elements, means direct coupling the bases of the other push-pull stage to the respective opposite ends of the other resistive bias element, and means connecting the collectors of said push-pull stage to said power supply.

7. A transistor amplifier as recited in claim 6 in combination with a pair of push-pull power stages each comprising a pair of transistors each having an emitter, a base and a collector, one transistor of each power stage having its emitter connected to the power supply and its collector connected to the emitter of the other transistor of the same stage, the collector of the other transistor of each power stage being connected to the power supply, the base of said one transistor of each power stage being direct coupled to the collector of one transistor of a respective one of said complementary push-pull stages, the base of the other transistor of each power stage being direct coupled to the emitter of the other transistor of each respective complementary push-pull stage, and a pair of output terminals each direct coupled respectively to the collector of said one transistor of each power stage.

8. A transistor amplifier as recited in claim 6 in combination with a pair of push-pull power stages each comprising a pair of transistors each having an emitter, a base and a collector, one transistor of each power stage having its emitter connected to ground and its collector connected to the emitter of the other transistor of the same stage, the collector of the other transistor of each power stage being connected to the ungrounded power supply terminal, the base of said one transistor of each power stage being connected to the collector of one transistor of a respective one of said complementary push-pull stages, the base of the other transistor of each power stage being connected to the emitter of the other transistor of each respective complementary push-pull stage, and a pair of output terminals each connected respectively to the collector of said one transistor of each power stage.

9. A power amplifier comprising a first single-ended push-pull power stage having a first output, a second single-ended push-pull stage having a second output, means for coupling a load to said outputs, a first drive circuit direct coupled to said first output stage for feeding a signal thereto, a second drive circuit direct coupled to said second output stage for feeding thereto an oppositely phased replica of said signal whereby each power stage operates in push-pull relation to the other power stage, means responsive to variations in the quiescent potential of said first output for varying the quiescent potential of the second output in accordance therewith to maintain in the second output quiescent potential approximately equal to the first output quiescent potential, and means responsive to variations in the quiescent potential of said second output for varying the quiescent potential of the first output in accordance therewith to maintain the first output quiescent potential approximately equal to the second output quiescent potential.

10. A transistor power amplifier comprising a first push-pull single-ended output stage, a first push-pull complementary symmetry drive stage direct-current-coupled to said first output stage, a first voltage-amplification stage direct-current-coupled to said first drive stage, a second push-pull single-ended output stage, a second push-pull complementary symmetry drive stage direct-current-coupled to said second output stage, a second voltage-amplification stage direct-current-coupled to said second drive stage, a pair of output terminals each direct-current-coupled to a respective one of said output stages for direct connection of a load therebetween, means for connecting said amplifier to a source of input signal, phase inverter means for feeding oppositely phased replicas of the input signal respectively to each of said voltage-amplification stages, each of said voltage-amplification stages comprising a transistor having an emitter, a collector, and a base, each of the collectors of said voltage-amplification stages being direct-current-coupled to a respective one of said drive stages, means for feeding said input signal to the base of one of said voltage-amplification transistors, an A.C. ground, said phase inverter means comprising capacitor means A.C.-coupling the base of the other voltage-amplification transistor to said ground, means mutually connecting the emitters of said voltage-amplification transistors, and a common resistive means connecting said emitters to said ground, at least part of said resistive means being unbypassed.

11. A transistor power amplifier comprising a first push-pull single-ended output stage, a first push-pull drive stage direct-current-coupled to said first output stage, a first voltage-amplification stage direct-current-coupled to said first drive stage, a second push-pull single-ended output stage, a second push-pull drive stage direct-current-coupled to said second output stage, a second voltage-amplification stage direct-current-coupled to said second drive stage, a pair of output terminals each direct-current-coupled to a respective one of said output stages for direct connection of a load therebetween, means for connecting said amplifier to a source of input signal, phase inverter means for feeding oppositely phased replicas of the input signal respectively to each of said voltage-amplification stages, each of said voltage-amplification stages comprising a transistor having an emitter, a collector, and a base, each of the collectors of said voltage-amplification stages being direct-current-coupled to a respective one of said drive stages, means for feeding said input signal to the base of one of said voltage-amplification transistors, an A.C. ground, said phase inverter means comprising means coupling the base of the other voltage-amplification transistor to said ground, means mutually connecting the emitters of said voltage-amplification transistors, and a common resistive means connecting said emitters to said ground, at least part of said resistive means being unbypassed.

12. A transistor power amplifier comprising a first push-pull single-ended output stage, a first push-pull drive stage direct-coupled to said first output stage, a first voltage-amplification means direct-coupled to said first drive stage, a second push-pull single-ended output stage, a second push-pull drive stage direct-coupled to said second output stage, a second voltage-amplification means direct-coupled to said second drive stage, a pair of output terminals each direct-coupled to a respective one of said output stages for direct connection of a load therebetween, means for connecting said amplifier to a source of input signal, phase inverter means for feeding oppositely phased replicas of the input signal respectively to each of said voltage-amplification means, each of said output stages comprising at least two transistors each having a collector, an emitter, and a base, the collector of one transistor of each stage being connected to the emitter of the other transistor of the same stage and to a respective one of said output terminals, the bases of said output transistors being directly coupled to the respective preceding drive stages, each of said drive stages comprising at least two transistors each having a base, means connecting both bases of each drive stage to a respective one of said voltage-amplification means, each of said voltage-amplification means comprising at least one transistor having an emitter, a collector, and a base, each of the collectors of said voltage-amplification means being connected to a respective one of said drive stages, means for feeding said input signal to the base of one of said voltage-amplification transistors, a ground, said phase inverter means comprising capacitor means coupling the base of the other voltage-amplification transistor to ground, means mutually connecting the emitters of said voltage-amplification transistors, a common resistive means connecting said emitters to ground, at least part of said resistive means being unbypassed, a first negative feedback means connected between one of said output terminals and one of said voltage-amplification means, and a second negative feedback means connected between the other output terminal and the other voltage-amplification means.

13. A transistor power amplifier comprising
- a power supply including a pair of terminals,
- a differential amplifier stage including a pair of transistors each having an emitter,
- a common impedance having one end connected to one of said supply terminals,
- means connecting the other end of said impedance to said emitters,
- one of said transistors having a collector,
- a load impedance extending from said collector to the other supply terminal,
- each of said transistors having a base,
- means transmitting a signal to one of said bases,
- an A.C. ground,
- impedance means connecting the other of said bases to said ground,
- a complementary-symmetry push-pull drive stage including a pair of transistors of opposite polarity types and each having a base,
- means direct-current-coupling said drive transistor bases to said collector,
- a push-pull output stage,
- means direct-current-coupling said output stage to said drive stage,
- an output terminal adapted to be direct-current-coupled to a load, and
- network means direct-current-coupling said output terminal to said output stage.

14. A transistor power amplifier as recited in claim 13 and comprising
- a direct-current negative feedback loop including said differential amplifier, drive and output stages and further including a direct-current feedback network extending from said output stage and direct-current-coupled thereto.

15. A transistor power amplifier as recited in claim 14 and comprising
- an input terminal,
- an input impedance network connected to said input terminal, and
- means direct-current-coupling said input impedance network to said base of said differential amplifier transistor, said feedback network having one end direct-current-coupled to said output terminal and its opposite end direct-current-coupled to said input impedance network.

16. A transistor power amplifier as recited in claim 13 and comprising a second complementary-system push-pull drive stage including a pair of transistors of opposite polarity types and each having a base, the other of said differential amplifier stage transistors having a collector, network means direct-current-coupling said second drive stage transistor bases to said other differential amplifier transistor collector, a second push-pull output stage, means direct-current-coupling said second output stage to said second drive stage, a second output terminal adapted to be direct-current-coupled to an end of said load opposite to the coupling thereto of said first-recited output terminal, and means direct-current-coupling said second output terminal to said second output stage.

17. A transistor power amplifier as recited in claim 16 and comprising a first direct-current feedback network extending from said first output stage to said differential amplifier stage, and a second direct-current feedback network extending from said second output stage to said differential amplifier stage.

18. A transistor power amplifier comprising a differential amplifier stage having a pair of outputs with respective oppositely-phased output signals, a pair of push-pull complementary-symmetry drive stages each direct-current-coupled to a respective one of said differential amplifier stage outputs, a pair of push-pull output stages each direct-current-coupled to a respective one of said drive stages, and a pair of output terminals for connection to a load and each direct-current-coupled to a respective one of said output stages.

19. A transistor power amplifier as recited in claim 18 wherein each of said drive stages comprises a pair of complementary transistors each having an emitter conductively connected to a respective one of said output terminals, one transistor of each of said drive stages having an emitter and the other transistor of said drive stage having a collector, each of said output stages comprising a pair of output transistors each having a base, means direct-current-coupling each of said drive stage transistor emitters to a respective one of said output stage transistor bases, and means direct-current-coupling each of said drive stage transistor collectors to the respective other output transistor base.

20. A transistor power amplifier as recited in claim 18 and comprising a direct-current negative feedback network having one end connected to a respective one of said output terminals and the other end connected to said differential amplifier stage, and a second direct-current negative feedback network having one end connected to the other output terminal and its other end connected to said differential amplifier stage.

References Cited

UNITED STATES PATENTS

| | | | |
|---|---|---|---|
| 3,018,445 | 1/1962 | Stone | 330—13 |
| 3,023,368 | 2/1962 | Erath | 330—17 |
| 3,073,899 | 1/1963 | Farnsworth | 179—1 |
| 3,087,015 | 4/1963 | Witzke | 179—1 |
| 3,153,203 | 10/1964 | Sem-Jacobsen | 330—69 |
| 3,154,639 | 10/1964 | Rakha | 330—13 |
| 3,212,019 | 10/1965 | Schwartz | 330—15 |

OTHER REFERENCES

Transistor Manual, 4th ed., N.Y., General Electric Company, 1959, p. 64.

Jacob Millman: Vacuum Tube and Semiconductor Electronics, 1958, p. 455.

WILLIAM C. COOPER, *Primary Examiner.*

R. P. TAYLOR, *Assistant Examiner.*